(12) United States Patent
Fukuhara (10) Patent No.: US 10,217,734 B2
(45) Date of Patent: Feb. 26, 2019

(54) SEMICONDUCTOR DEVICE (71) Applicant: DENSO CORPORATION, Kariya, Aichi-pref. (JP)

(72) Inventor: Jun Fukuhara, Kariya (JP)

(73) Assignee: DENSO CORPORATION, Kariya (JP)

( * ) Notice: Subject to any disclaimer, the term of this patent is extended or adjusted under 35 U.S.C. 154(b) by 182 days.

(21) Appl. No.: 15/442,884

(22) Filed: Feb. 27, 2017

(65) Prior Publication Data
US 2017/0256938 A1 Sep. 7, 2017

(30) Foreign Application Priority Data

Mar. 3, 2016 (JP) .................................. 2016-041374

(51) Int. Cl.
*H01L 27/02* (2006.01)
*H02H 9/04* (2006.01)
*H02H 9/00* (2006.01)
*H03K 17/082* (2006.01)

(52) U.S. Cl.
CPC ......... *H01L 27/0285* (2013.01); *H02H 9/005* (2013.01); *H02H 9/04* (2013.01); *H02H 9/041* (2013.01); *H03K 17/0822* (2013.01)

(58) Field of Classification Search
CPC ........... H02H 9/04; H02H 9/041; H02H 9/046
USPC .......................................................... 361/56
See application file for complete search history.

(56) References Cited

U.S. PATENT DOCUMENTS

| | | | |
|---|---|---|---|
| 5,608,595 A | 3/1997 | Gourab et al. | |
| 6,064,249 A * | 5/2000 | Duvvury | H01L 27/0255 327/314 |
| 6,385,028 B1 * | 5/2002 | Kouno | H01L 27/0629 257/E27.016 |
| 8,802,509 B2 * | 8/2014 | Su | H01L 27/0255 438/128 |
| 2007/0279106 A1 * | 12/2007 | Bennett | H03K 17/0822 327/110 |
| 2010/0302693 A1 * | 12/2010 | Hayashi | H01L 27/0251 361/56 |
| 2011/0195744 A1 * | 8/2011 | Zhang | H02H 11/003 455/550.1 |
| 2012/0307532 A1 * | 12/2012 | Godo | H01L 27/0688 363/37 |

(Continued)

FOREIGN PATENT DOCUMENTS

JP  2001-085618 A  3/2001

*Primary Examiner* — Dharti H Patel
(74) *Attorney, Agent, or Firm* — Posz Law Group, PLC (57) ABSTRACT

In a semiconductor device, a control circuit controls a potential difference of a switching element between a first terminal connected to a power source node and a second terminal connected to a first reference node. A first clamping circuit is connected between the first terminal and a control terminal of the switching element and is energized by a voltage equal to or higher than a first clamp voltage. A second clamping circuit is connected between the control terminal and the first reference node and clamps the potential difference to a second clamp voltage lower than the first clamp voltage. A third clamping circuit is connected between the control terminal and the second terminal. The control unit activates the second clamping circuit when a load current is equal to or greater than a predetermined threshold voltage, and activates the third clamping circuit after a predetermined time period elapses.

4 Claims, 4 Drawing Sheets

(56) References Cited

U.S. PATENT DOCUMENTS

2013/0328610 A1 12/2013 Hayashi
2015/0145583 A1 5/2015 Hayashi

\* cited by examiner

SEMICONDUCTOR DEVICE

CROSS REFERENCE TO RELATED APPLICATION

This application is based on Japanese Patent Application No. 2016-41374 filed on Mar. 3, 2016, the disclosure of which is incorporated herein by reference.

TECHNICAL FIELD

The present disclosure relates to a semiconductor device having a dynamic clamping circuit that limits a potential difference between output terminals of a switching element.

BACKGROUND

In a semiconductor device having a MOSFET as a switching element, it has been known to set a clamp voltage of a drain-to-source voltage Vds to a level equal to or higher than a surge voltage, which is represented by load dump, so as to keep an off state of the MOSFET to thereby restrict breakdown of the element.

However, when the drain-to-source voltage Vds is clamped at a relatively high voltage, which corresponds to the surge voltage, during a protection operation or the like in an overcurrent detection, the electric power consumption during the protection operation is likely to increase. Also, heat is generated due to the large amount of power consumption. Further, since the element has been reduced in size, the increase in the heat generation amount due to the increase in the drain-to-source voltage Vds is notable, as compared with a conventional element.

JP 2001-85618 A discloses a semiconductor integrated circuit that is capable of varying a clamp voltage. In the semiconductor integrated circuit, the clamp voltage is increased in a case where the high surge voltage is assumed, and is decreased in a case where the element needs to absorb high energy for a short time, which is represented by a short-circuit of a load. In the semiconductor device, therefore, the power consumption when the element absorbs the high energy can be reduced, and the amount of heat generation can be reduced.

SUMMARY

There is a need to arrange a load at a position adjacent to a reference potential relative to the switching element, for example, on a ground potential side, concerning an unexpected current flowing to the switching element due to a ground fault of the load or the like. That is, there is a need to use the dynamic clamping circuit in a high-side driver.

In the semiconductor integrated circuit of JP 2001-85618 A, however, the clamp voltage controlled by the dynamic clamping circuit needs to be set relative to the ground potential as a reference. Since the dynamic clamping circuit of JP 2001-85618 A is configured to be used only in a low-side driver in which the load is arranged on a source side relative to the switching element, the dynamic clamping circuit cannot satisfy the need to be used in the high-side driver.

It is an object of the present disclosure to provide a semiconductor device having a clamping circuit with a simple configuration, which can be used in a high-side driver and a low-side driver.

According to an aspect of the present disclosure, a semiconductor device includes a control unit, a first clamping circuit, a second clamping circuit and a third clamping circuit. The control unit controls a potential difference between a first terminal and a second terminal of a switching element to a predetermined clamp voltage. The switching element is connected in series to a load between a power source node having a power source potential and a first reference node having a predetermined reference potential. The first terminal is adjacent to the power source node, and the second terminal is adjacent to the first reference node. The switching element has a control terminal to control a current flowing between the first terminal and the second terminal. The first clamping circuit is connected between the first terminal and the control terminal of the switching element, and is energized by a voltage equal to or higher than a first clamp voltage. The second clamping circuit is connected between the control terminal and a second reference node having a reference potential of the control unit. The second clamping circuit clamps the potential difference to a second clamp voltage lower than the first clamp voltage by charging or discharging charges of the control terminal. The third clamping circuit is connected between the control terminal and the second terminal, and discharges the charges of the control terminal. The control unit includes a current detector that detects a load current flowing in the load. The control unit activates the second clamping circuit when the load current is equal to or greater than the predetermined threshold, and activates the third clamping circuit when a predetermined time period elapses after the second clamping circuit is activated.

In the above configuration, since the potential difference between the first terminal and the second terminal can be kept at a high voltage higher than the first clamp circuit when a surge voltage due to such as load dump occurs, the off state of the switching element can be maintained.

When an overcurrent caused by a short circuit of the load or the like occurs, the potential difference is clamped to the second clamp voltage that is lower than the first clamp voltage by the second clamping circuit. Therefore, power consumption of the switching element can be reduced, and the heat generation amount can be suppressed. The second clamping circuit realizes the second clamp voltage by charging or discharging the charges of the control terminal of the switching element with reference to the second reference node. Therefore, the function of clamping the potential difference can be realized, regardless of the connection relationship between the load and the switching element, that is, regardless of the position of the switching element on the high side or the low side.

Further, the third clamping circuit discharges the charges of the control terminal of the switching element with reference to the second terminal. Namely, since a potential difference between the control terminal and the second terminal can be made substantially equal. Therefore, the switching element can be kept in an off state certainly.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, embodiments of the present disclosure will be described with reference to the drawings. In the embodiments described hereinafter, like or equivalent parts will be designated with like reference numbers, and description thereof will not be repeated. When only a part of the configuration is described in a certain embodiment, the other part of the configuration employs any of the preceding embodiments. The combination of the embodiments is not limited to the combination specifically described in the present specification. For example, the embodiments may be partially combined with each other provided that the combination of the embodiment will not bring any difficulty even when the combination is not explicitly described.

First Embodiment

Firstly, a schematic structure of a semiconductor device according to the present embodiment will be described with reference to FIGS. 1 and 2.

Figure 2:
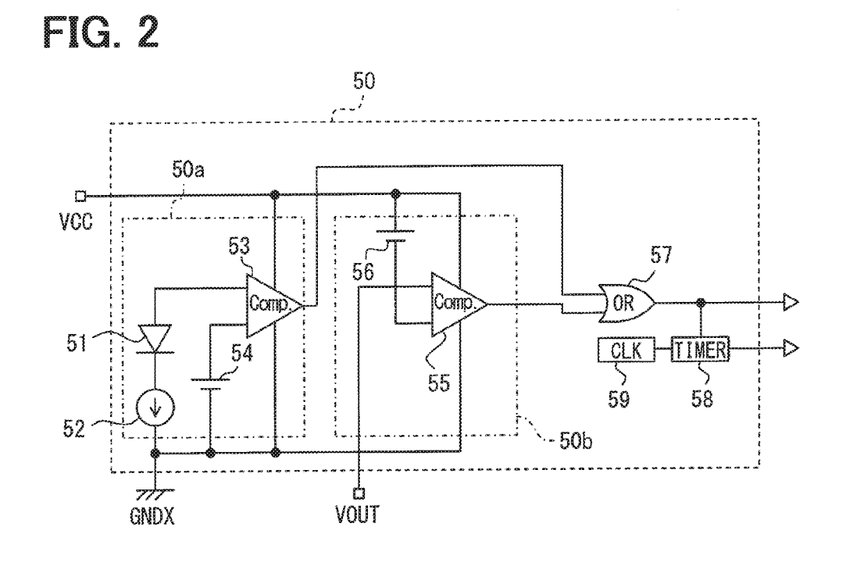
FIG. 2 is a circuit diagram of a control unit of the semiconductor device according to the first embodiment.

As shown in FIG. 2, a semiconductor device 100 of the present embodiment is a drive device that applies a gate voltage to a gate electrode G of a switching element 300 for controlling a current flowing in a load 200. The gate electrode G corresponds to a control terminal. The load 200 is, for example, a resistor with a predetermined resistance value, and has predetermined inductance inclusive of wiring.

The switching element 300 is, for example, a metal oxide semiconductor field effect transistor (MOSFET). The switching element 300 is a three-terminal element including the gate electrode G as the control terminal, and a drain electrode D and a source electrode S in which an output current flows. The drain electrode D and the source electrode S correspond to a first terminal and a second terminal, respectively.

In the present embodiment, the switching element 300 is the MOSFET, as an example. However, the switching element 300 is not limited to a specific kind, and may be an IGBT, for example. In a case where the switching element 300 is an IGBT, the first terminal is a collector electrode and the second terminal is an emitter electrode, in place of the drain electrode D and the source electrode S, respectively.

The switching element 300 and the load 200 are connected in series, between a power source node T0 having a power source potential VCC and a first reference node T1 having a predetermined reference potential GNDP. In the example shown in FIG. 1, the switching element 300 is arranged at a position adjacent to the power source potential VCC, relative to the load 200. That is, the switching element 300 is arranged as a high-side arrangement. Specifically, the drain electrode D of the switching element 300 is connected to the power source node T0, and the source electrode S of the switching element 300 is connected to one end of the load 200. The other end of the load 200 is connected to the first reference node T1.

The semiconductor device 100 is a drive device for applying a gate voltage to the gate terminal G. The semiconductor device 100 includes a driver 10 outputting the gate voltage, a first clamping circuit 20, a second clamping circuit 30, a third clamping circuit 40 and a control unit 50.

The driver 10 is provided by a drive circuit that is generally used in a gate drive circuit. As the drive circuit, one that has a suitable driving capability according to a gate capacitance of the switching element 300 or an output current to flow is selected, and the configuration of the drive circuit is not described in detail.

Figure 1:
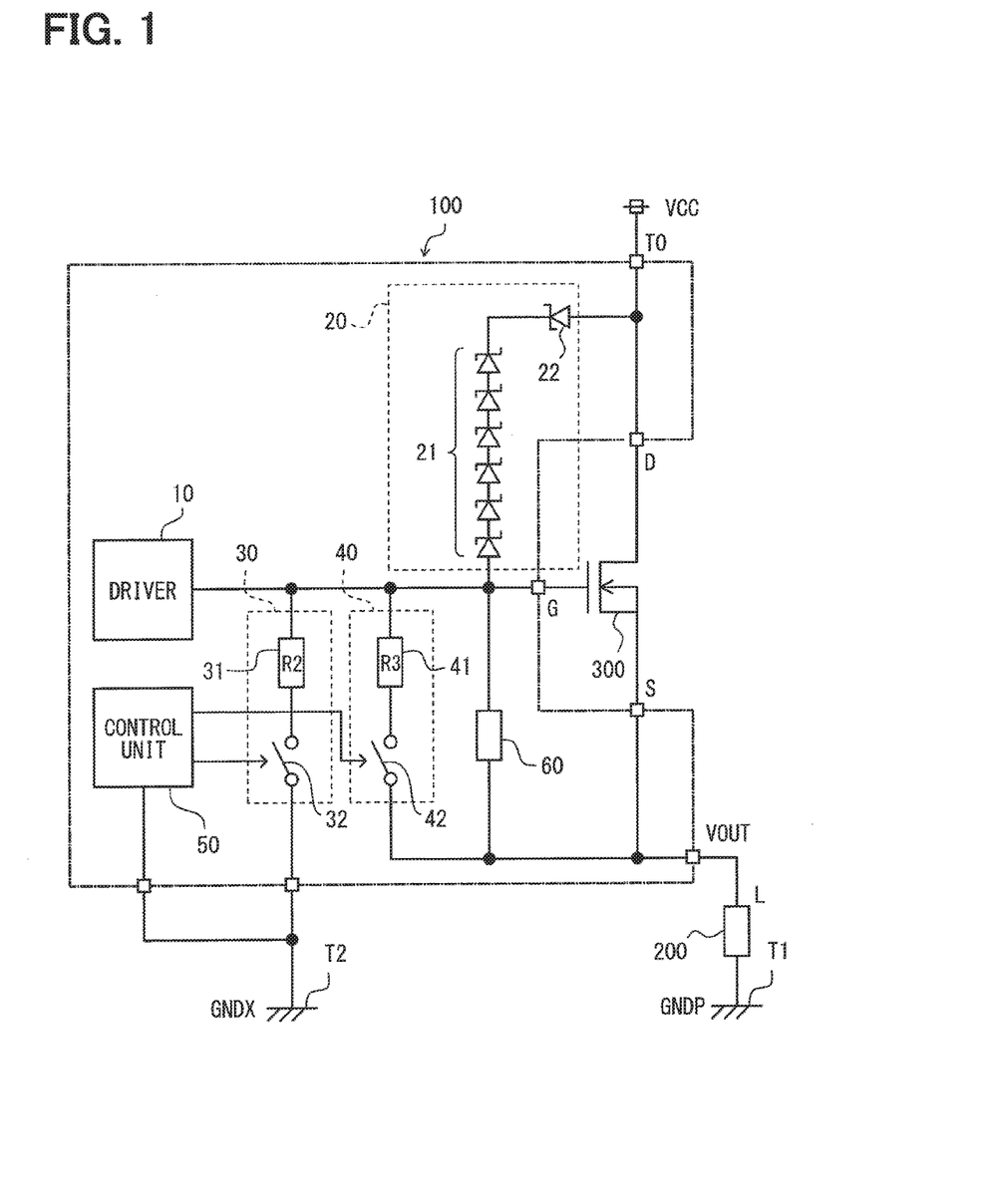
FIG. 1 is a circuit diagram of a semiconductor device according to a first embodiment of the present disclosure.

As shown in FIG. 1, the first clamping circuit 20 is connected between the gate electrode G and the drain electrode D. The first clamping circuit 20 includes a plurality of Zener diodes 21 that are connected in series so that the cathode thereof is connected to the drain electrode D. The first clamping circuit 20 further includes a diode 22 that limits the current flowing from the gate electrode G to the drain electrode D.

The semiconductor device 100 includes a gate resistor 60 disposed between the gate electrode G and the source electrode S. When the second clamping circuit 30 and the third clamping circuit 40 are deactivated, the drain-to-source voltage Vds, which is defined relative to the source electrode S as a reference, is clamped to VZe+Vt relative to VCC. VZe is a voltage that is specified by the Zener diodes 21, and is variable depending on the number of Zener diodes 21 connected in series. Vt is a threshold voltage of the switching element 300. In this case, the clamp voltage Vds is expressed as Vds≈VZe+Vt, and is also referred to as a first clamp voltage. Strictly, the clamp voltage includes a forward voltage VF of the diode 22. However, for the sake of simplification of the description, the clamp voltage is approximate to VZe+Vt in the following description.

As shown in FIG. 1, the second clamping circuit 30 is disposed between the gate electrode G as the control terminal and a second reference node T2 having a predetermined reference potential GNDX. The second clamping circuit 30 includes a resistor 31 having a predetermined resistance value R2, and a switch 32 disposed between the resistor 31 and the second reference node T2.

The second clamping circuit 30 is activated when the switch 32 is turned on (closed) and the gate electrode G is connected to the second reference node T2 through the second clamping circuit 30. The switch 32 is turned on when receiving an enable signal from the control unit 50. The switch 32 is, for example, provided by a MOSFET.

When the second clamping circuit 30 is activated in a state where the third clamping circuit 40 is deactivated, the gate electrode G is clamped to the voltage approximate to the reference potential GNDX. Thus, the voltage Vds is clamped to VCC+Vt, relative to the GNDX as a reference. This clamp voltage Vds is expressed as Vds≈VCC+Vt, and is also referred to as a second clamp voltage.

As shown in FIG. 1, the third clamping circuit 40 is disposed between the gate electrode G as the control terminal and the source electrode S. That is, the third clamping circuit 40 is connected in parallel to the gate resistor 60. The third clamping circuit 40 includes a resistor 41 having a predetermined resistance value R3, and a switch 42 disposed between the resistor 41 and the source electrode S.

The third clamping circuit 40 is activated when the switch 42 is turned on (closed) and the gate electrode G is connected to the source electrode S through the third clamping circuit 40. The switch 42 is turned on when receiving an enable signal from the control unit 50. The switch 42 is, for example, provided by a MOSFET.

When the third clamping circuit 40 is activated, the gate electrode G has substantially the same potential as that of the source electrode S. Therefore, the switching element 300 can be made in the off state more certainly.

The control unit 50 controls on and off of the switch 32 of the second clamping circuit 30 and the switch 42 of the third clamping circuit 40. As shown in FIG. 2, the control unit 50 of the present embodiment includes an overheat detector 50a and an overcurrent detector 50b.

The overheat detector 50a includes a thermosensitive diode 51, a constant current source 52 that supplies a constant current to the thermosensitive diode 51, a comparator 53, and a reference power source 54 that supplies a reference voltage to the comparator 53. The comparator 53 is configured to have the power source potential VCC and the reference potential GNDX.

The thermosensitive diode 51 is, for example, arranged adjacent to the switching element 300. The thermosensitive diode 51 inputs to the comparator 53 a voltage value that is based on an ambient temperature of the thermosensitive diode 51 and a current value specified by the constant current source 52. The reference voltage specified by the reference power source 54 is set to a voltage corresponding to a threshold temperature at which the switching element 300 is determined as an overheated state. The comparator 53 compares the voltage based on the temperature and the reference voltage, and outputs a signal that indicates enablement when the temperature of the switching element 300 is higher than the threshold temperature.

The overcurrent detector 50b includes a comparator 55, and a reference power source 56 that supplies a reference voltage to the comparator 55. Similarly to the comparator 53 of the overheat detector 50a, the comparator 55 is configured to have the power source potential VCC and the reference potential GNDX. The reference voltage specified by the reference power source 56 is set to a voltage corresponding to a threshold current at which the output current flowing to the switching element 300 is determined as an overcurrent.

The comparator 55 is applied with a source voltage (VOUT) corresponding to the current flowing in the witching element 300. The comparator 55 compares the source voltage based on the output current and the reference voltage, and outputs a signal that indicates enablement when the output current of the switching element 300 is greater than the threshold current. This overcurrent detector 50b corresponds to a current detector.

The output of the comparator 53 of the overheat detector 50a and the output of the comparator 55 of the overcurrent detector 50b are applied to an OR circuit 57. The OR circuit 57 outputs a signal that indicates enablement when at least one of the signals from the comparators 53 and 55 indicates the enablement.

An output signal of the OR circuit 57 is provided to the switch 32 of the second clamping circuit 30 as well as to a timer 58. The timer 58 is connected to an oscillator 59. The timer 58 outputs an enable signal when a predetermined time period elapses after the enable signal is received from the OR circuit 57. The enable signal output from the timer 58 is provided to the switch 42 of the third clamping circuit 40.

As described above, when the overheat detector 50a detects the overheat, or when the overcurrent detector 50b detects the overcurrent, the control unit 50 outputs the enable signal to the switch 32 to activate the second clamping circuit 30. Further, when the predetermined time period has elapsed, the control unit 50 outputs the enable signal to the switch 42 to activate the third clamping circuit 40.

The predetermined time period $\tau$ from the time the timer 58 receives the enable signal to the time the timer 58 outputs the enable signal may be set arbitrary. Further, the predetermined time period $\tau$ is preferably set so that the energy stored in the inductance L including the load 200 and the wirings can be absorbed by the switching element 300. The time period t required for the switching element 300 to absorb the energy stored in the inductance L is expressed as $t=IL/(V_2-VCC)$ in which I represents a load current and $V_2$ represents the second clamp voltage.

Further, since the predetermined time period $\tau$ from the time the timer 58 receives the enable signal to the time the timer 58 outputs the enable signal is preferably set to the time period so that the switching element 300 can absorb the energy stored in the inductance L, the predetermined time period $\tau$ is preferably set to satisfy the relation of $\tau \geq t=IL/(V_2-VCC)$.

Next, referring to FIG. 3, an operation of the semiconductor device 100 of the present embodiment will be described in regard to a short-circuit of the load 200 as an example.

Figure 3:
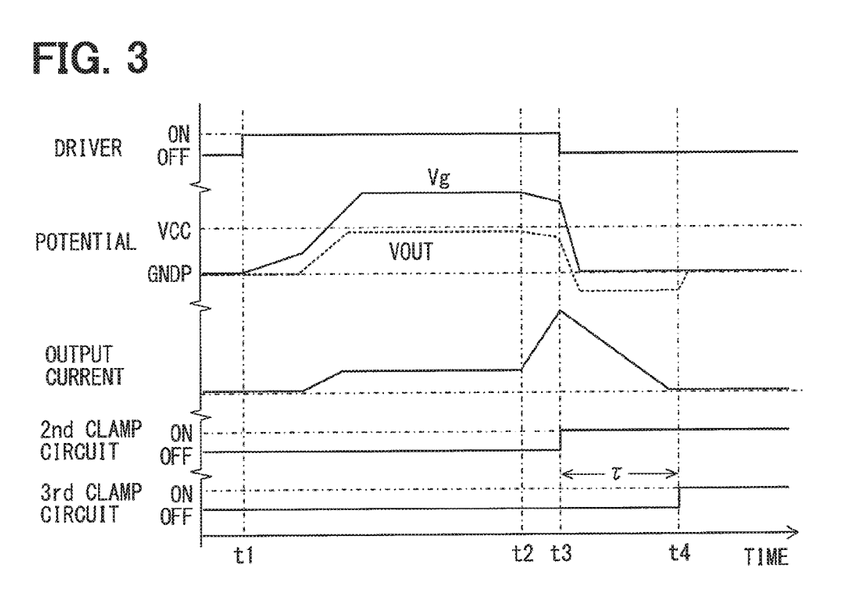
FIG. 3 is a time chart illustrating operations of a second clamping circuit and a third clamping circuit of the semiconductor device according to the first embodiment.

At a time t1 in FIG. 3, when energization of the load 200 is instructed such as by an electric control unit (ECU), which is not shown, the driver 10 becomes in an on state and begins to apply the gate voltage Vg. The voltage VOUT, which corresponds to the source voltage of the switching element 300, increases with the increase in the gate voltage Vg, and thus the output current flows.

It is assumed that a short circuit occurs in the load 200 at a time t2. When the output current increases and the control unit 50 detects overcurrent at a time t3, the drive of the driver 10 is turned off and the second clamping circuit 30 is activated. Therefore, the gate electrode G of the switching element 300 is clamped with reference to the potential GNDX, which is the reference potential of the control unit 50. Further, the gate-to-source voltage Vds is clamped to the second clamp voltage, which is expressed as Vds≈VCC+Vt.

The term VZe of the first clamp voltage is set sufficiently greater than VCC so as to cope with a high voltage such as load dump, and thus the first clamp voltage is higher than the second clamp voltage. In other words, since the second clamp voltage is sufficiently lower than the first clamp voltage, the power consumption caused by overcurrent due to the short-circuit can be reduced, and the amount of heat generation can be suppressed.

In the semiconductor device 100 of the present embodiment, the gate electrode G of the switching element 300 is clamped with reference to the GNDX. Therefore, the clamping of the drain-to-source voltage Vds can be realized without using a complex circuit such as a level-shift circuit. This clamping can be realized in the high side driver as in the present embodiment.

At a time t4, that is, when the predetermined time period $\tau$ elapses after the second clamping circuit 30 is activated at t3, the third clamping circuit 40 is activated. In this case, since the switching element 300 is in a state where the gate electrode G and the source electrode S are substantially short, the switching element 300 can be made to an off state more certainly.

In the present embodiment, the gate electrode G of the switching element 300 is exemplarily clamped with reference to GNDX, which is the reference potential of the control unit 50, when the second clamping circuit 30 is activated. Alternatively, the gate electrode G may be connected to the reference potential GNDP. Namely, the second reference node may be the same as the first reference node.

It is preferable that the gate electrode G is connected to a node that has a stable potential when the second clamping circuit 30 is activated. Therefore, the gate electrode G is preferably connected to a control-system module such as the control unit 50 or an ECU so as to be connected to the reference potential that is required to be more stable.

(Modification)

Figure 4:
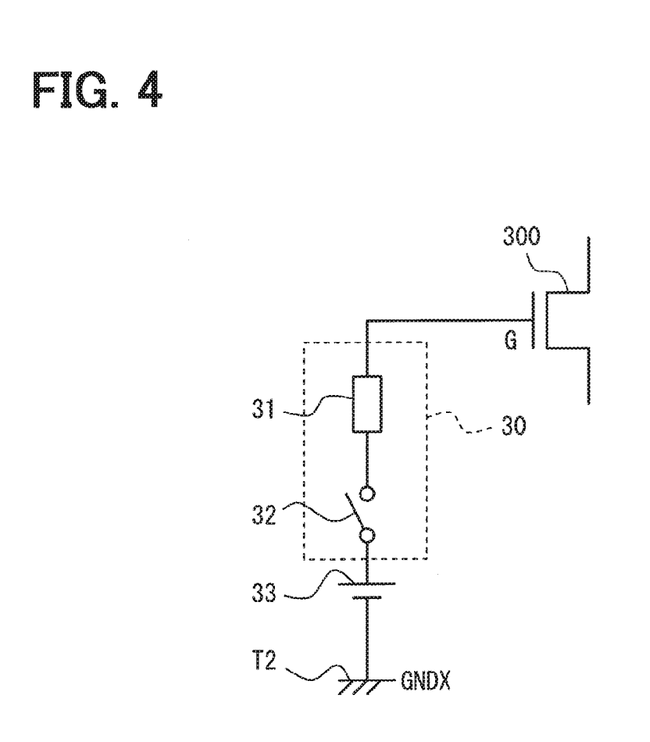
FIG. 4 is a circuit diagram illustrating a modification of the second clamping circuit.

As a modification shown in FIG. 4, the semiconductor device 100 includes a boosting part 33 that increases the potential of the second clamping circuit 30 to a potential higher than GNDX set to the second reference node T2, between the second clamping circuit 30 and the second reference node T2.

In a case where the switch 42 of the third clamping circuit 40 is an NMOS (n-channel metal oxide semiconductor), when the second clamping circuit 30 is activated and the gate electrode G of the switching element 300 is clamped to a potential approximate to the reference potential GNDX, there is a fear that the switch 42 is erroneously turned on depending on the threshold voltage. In the semiconductor device 100 of the modification, the gate voltage when the second clamping circuit 30 is turned on can be higher than that in a configuration without having the boosting part 33. Therefore, it is less likely that the third clamping circuit 40 will be unexpectedly activated.

The boosting part 33 is not limited to the power source circuit shown in FIG. 4, as long as the second clamping circuit 30 can have a potential higher than the GNDX. For example, the boosting part 33 may include a diode, an NMOS in which the gate and the drain are shorted, or the like.

Second Embodiment

In the first embodiment, the semiconductor device 100 is exemplarily employed to the high side driver in which the switching element 300 is arranged adjacent to the power source potential VCC relative to the load 200. In the second embodiment, on the other hand, the semiconductor device 100 is exemplarily employed to a low-side driver.

Figure 5:
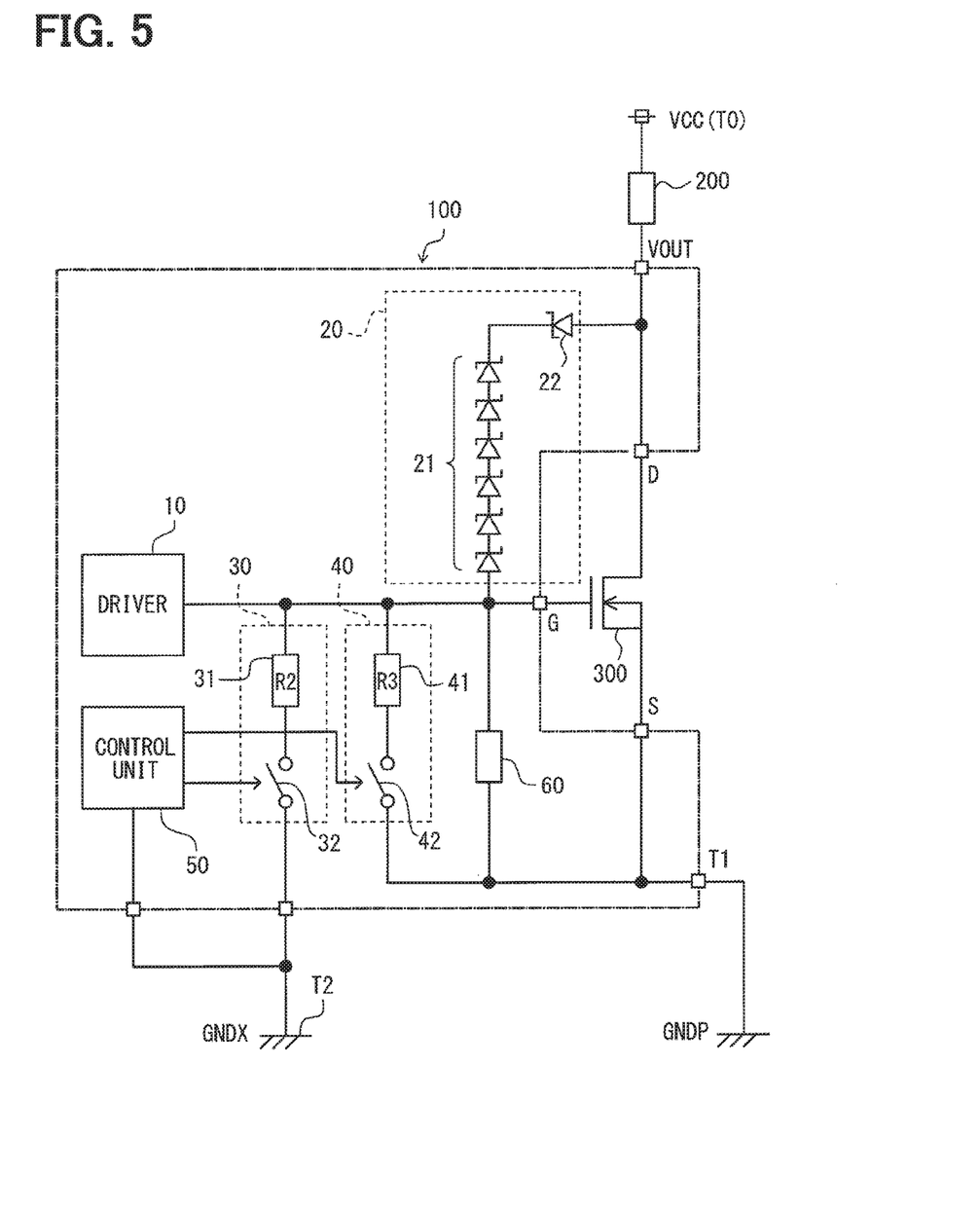
FIG. 5 is a circuit diagram of a semiconductor device according to a second embodiment of the present disclosure.

In the second embodiment, the semiconductor device 100 have the similar elements to the semiconductor device 100 of the first embodiment. In the present embodiment, the drain electrode D of the switching element 300 is connected to the power source node T0 through the load 200, as shown in FIG. 5. Further, the source electrode S is directly connected to the first reference node T1. An end of the first clamping circuit 20 is connected to a midpoint between the drain electrode D and the load 200, and the other end of the first clamping circuit 20 is connected to the gate electrode G.

Accordingly, the semiconductor device 100 can be employed to both of the high side driver and the low side driver without changing the circuit configuration.

Other Embodiments

The embodiments and modification are described hereinabove. However, the present disclosure is not limited to the embodiments and modification described hereinabove, but may be further modified in various other ways without departing from the gist of the present disclosure.

In the embodiments described hereinabove, the resistor 31 of the second clamping circuit 30 can be replaced by a Zener diode or a constant current source, which can charge or discharge the gate electrode G of the switching element 300.

In the embodiments described hereinabove, the resistor 41 of the third clamping circuit 40 can be replaced by a Zener diode or a constant current source, which can charge or discharge the gate electrode G of the switching element 300.

In the case where the resistors 31, 41 are replaced by the constant current sources, the current value of the constant current source of the third clamping circuit 40 is set to be higher than that of the second clamping circuit 30. In this case, after the clamping operation by the second clamping circuit 30, the potential Vg of the gate electrode G depends on the constant current caused by the third clamping circuit 40. Therefore, the switching element 300 can be turned off by the third clamping circuit 40 more certainly.

The switch 32 and the switch 42 may be replaced by diodes. In such a case, the resistor 31 and the resistor 41 are configured so that the resistance value R2 of the resistor 31 is greater than the resistance value R3 of the resistor 41 (R2>R3). In this case, after the clamping operation by the second clamping circuit 30, the potential Vg of the gate electrode G depends on the resistance value R3. Therefore, the switching element 300 can be turned off by the third clamping circuit 40 more securely.

In the embodiments described above, the configuration of the control unit 50 is not limited to the configuration shown in FIG. 2. The control unit 50 may have any configuration as long as the control unit 50 can detect an abnormality in the output current of the switching element 300.

What is claimed is:

1. A semiconductor device comprising:
   a control unit that controls a potential difference between a first terminal and a second terminal of a switching element to a predetermined clamp voltage, the switching element being connected in series to a load between a power source node having a power source potential and a first reference node having a predetermined reference potential, the first terminal of the switching element being adjacent to the power source node and the second terminal of the switching element being adjacent to the first reference node, the switching element including a control terminal for controlling a current flowing between the first terminal and the second terminal;
   a first clamping circuit that is connected between the first terminal and the control terminal, and is energized at a voltage equal to or higher than a first clamp voltage;
   a second clamping circuit that is connected between the control terminal and a second reference node having a reference potential of the control unit, and clamps the potential difference to a second clamp voltage lower than the first clamp voltage by charging or discharging charges of the control terminal; and
   a third clamping circuit that is connected between the control terminal and the second terminal, and discharges the charges of the control terminal, wherein
   the control unit includes a current detector that detects a load current flowing in the load, and
   the control unit activates the second clamping circuit when the load current is equal to or greater than a predetermined threshold, and activates the third clamping circuit when a predetermined time period elapses after the second clamping circuit is activated.

2. The semiconductor device according to claim 1, further comprising:
   a boosting part that is disposed between the second clamping circuit and the second reference node, and increases a potential of the second clamping circuit relative to the reference potential of the control unit.

3. The semiconductor device according to claim 2, wherein
   the predetermined time period is referred to as $\tau$, and
   the predetermined time period $\tau$ satisfies a relation of $\tau \geq IL/(V_2 - VCC)$, in which L represents inductance inclusive of the load, I represents a current value flowing in the load, $V_2$ represents the second clamp voltage, and VCC represents the power supply potential.

4. The semiconductor device according to claim 1, wherein
the predetermined time period is referred to as $\tau$, and
the predetermined time period $\tau$ satisfies a relation of $\tau \geq IL/(V_2-VCC)$, in which L represents inductance inclusive of the load, I represents a current value flowing in the load, $V_2$ represents the second clamp voltage, and VCC represents the power supply potential.

* * * * *